United States Patent [19]

Noschese

[11] 4,119,818
[45] Oct. 10, 1978

[54] INTERCONNECTING MODULE

[75] Inventor: Rocco James Noschese, Wilton, Conn.

[73] Assignee: Burndy Corporation, Norwalk, Conn.

[21] Appl. No.: 646,701

[22] Filed: Jan. 2, 1976

[51] Int. Cl.$^2$ .................. H01H 9/20; H01H 33/46
[52] U.S. Cl. .......................... 200/50 AA; 200/51.09
[58] Field of Search ............ 200/50 AA, 51.09, 50 A, 200/50 B, 50 R

[56] References Cited

U.S. PATENT DOCUMENTS

| | | | |
|---|---|---|---|
| 1,566,935 | 12/1925 | Trencham et al. | 200/50 AA |
| 2,900,464 | 8/1959 | Frink et al. | 200/50 AA |
| 3,437,768 | 4/1969 | Miller | 200/50 AA |
| 3,801,757 | 4/1974 | Carissimi et al. | 200/51.09 X |

Primary Examiner—Thomas J. Kozma
Attorney, Agent, or Firm—Howard S. Reiter

[57] ABSTRACT

This invention relates to apparatus for locking drawer-like electronic component modules into position while sequentially engaging zero entry force component connectors and/or associated power circuit connectors.

5 Claims, 4 Drawing Figures

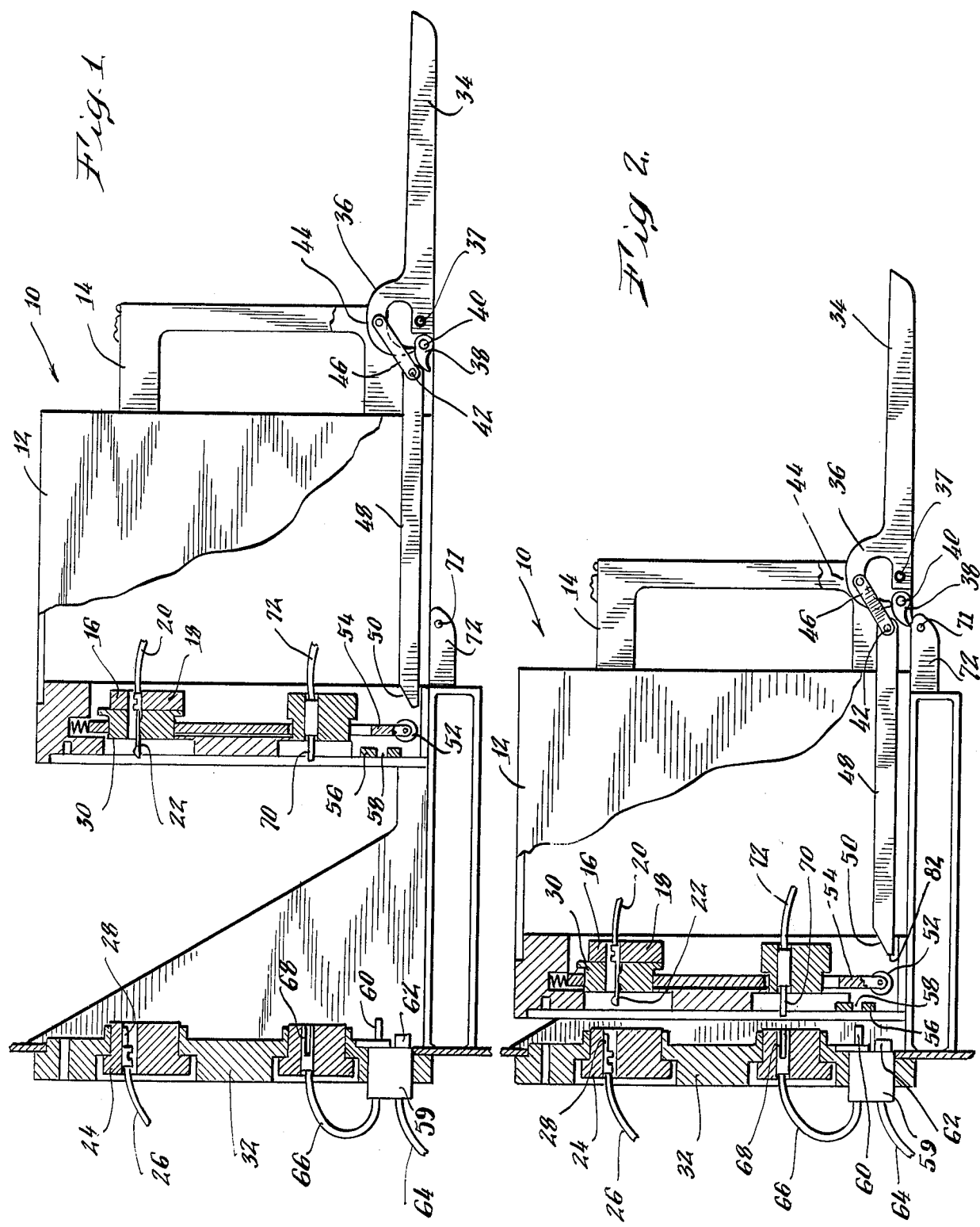

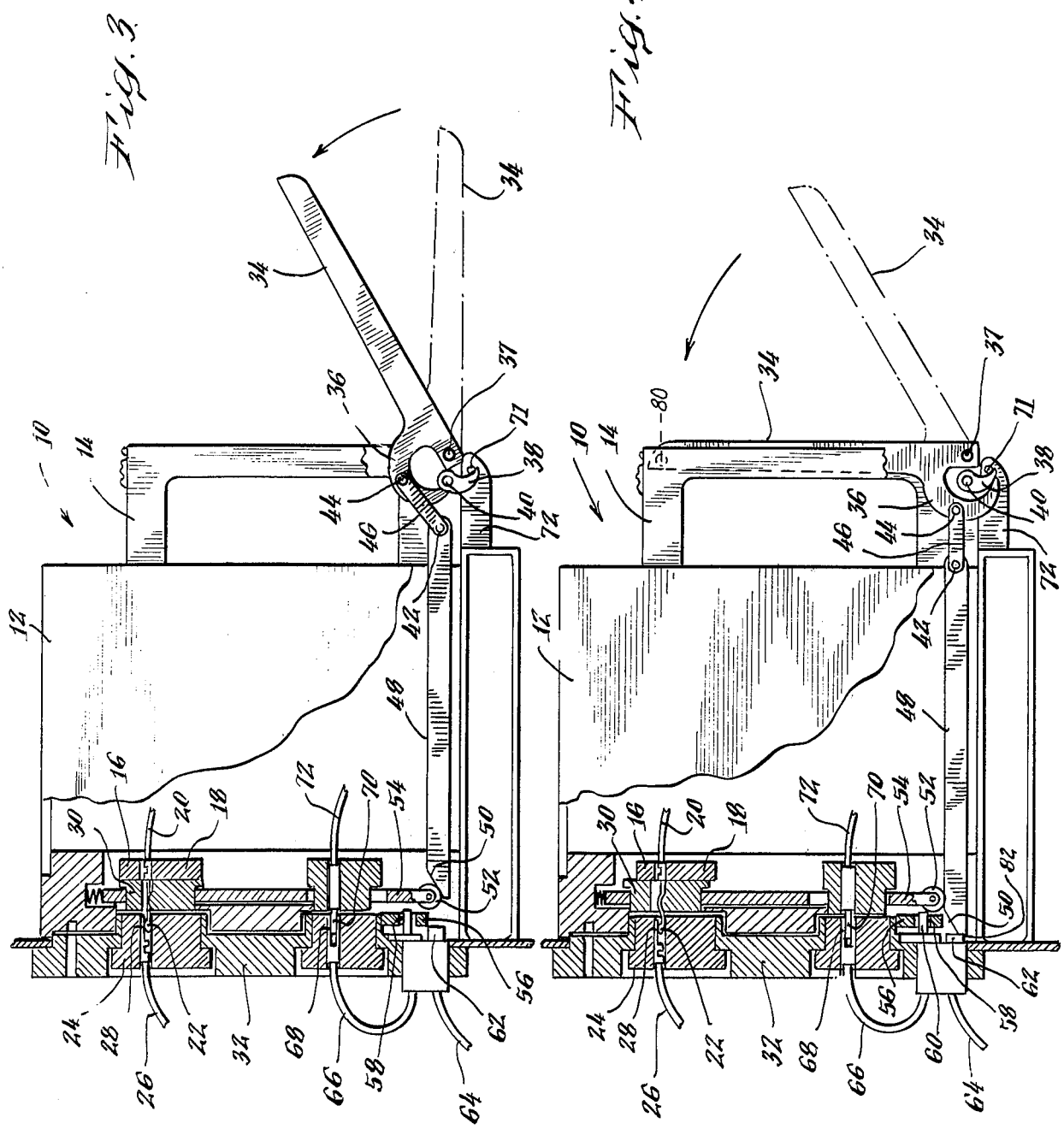

INTERCONNECTING MODULE

BACKGROUND OF THE INVENTION

In the field of electronics, and particularly in their application to aircraft and other moving vehicles, frequently it is desired to install modules containing a multiplicity of components in such a fashion as to ensure that they will remain in a desired location while being readily removable at will. Such modules are often made in the form of drawer-like structures having connectors projecting from the back, by means of which circuits may be completed between components contained within the drawer-like module and the circuitry with which the module is to be associated.

Further, such modules typically are equipped with handles by means of which they may be locked in position once the modules are positioned in their desired locations. The purpose of this locking feature is to prevent the modules from becoming disassociated from their associated circuitry by virtue of motion of the aircraft or other vehicle in which the installation is made.

Certain problems have arisen in connection with the use of such devices. For example, it has been found desirable to have such modules designed to have so called "zero entry" features; that is, connector components so designed that connector contacts projecting from the back of the module may be positioned next to corresponding connector contacts extending from the associated circuitry, which contacts may later be brought together by appropriate physical motion to effect physical contact and therefore electrical continuity between them. The advantage of such structures is that it is possible to avoid intricate alignment problems among circuit elements which are relatively small and therefore have limited physical properties in the interest of achieving weight reduction and/or of providing that a maximum number of contacts may occupy a given physical area.

It has also been found desirable to have such modules equipped with a means for effecting electrical connections by which power may be supplied to the modules and to have such connections occur after interconnection has occurred between the electronic or other "signal" portions of the module and the associated circuitry to which the module is attached. Conversely, it has been found desirable to incorporate the means by which the primary power input to the module can be disconnected prior to the disconnection of the electronic or other "signal" portions of the module with their associated circuitry and prior to the removal of the module physically from the position it normally occupies during use.

Accordingly it is an object of this invention to provide a means for electrically incorporating circuit modules into associated circuitry.

Yet another object of this invention is to provide such a means wherein such modules may be locked in position against migration from their desired locations.

Still another object of this invention is to provide a means whereby "zero entry" features may be utilized in effecting the installation of such a module with its associated circuitry.

Still another object of this invention is to provide a means whereby electrical energization of such a module may occur after it is locked in place and its associated electronic or "signal" circuitry is electrically interconnected with its associated circuitry, and whereby the primary source may be disconnected prior to disconnection of the electronic circuitry in the module and/or the removal of the module from its ordinary location.

SUMMARY OF THE INVENTION

Desired objects may be achieved through practice of the present invention which, in one embodiment, comprises a drawer-like electronic circuit module having a locking handle member by motion of which an associated mechanism may be caused first to lock the module into its desired position juxtaposed to the circuitry with which it is to be associated, and by further a motion of which an actuator rod may be caused to interconnect associated electronic or "signal" circuitry contacts and thereafter to effect energization of all or part of the electronic circuitry contained within the module by means of a contact being interconnected with an associated power source, and by counter-directional motion of which handle after the aforesaid sequence has occurred, the aforesaid sequence may be reversed.

DESCRIPTION OF PREFERRED DRAWINGS

This invention may be clearly understood from the description which follows and from the attached drawings in which FIG. 1 illustrates one embodiment of the present invention in a first stage of use, FIG. 2 illustrates the embodiment of this invention shown in FIG. 1 in a second stage of use, FIG. 3 illustrates the embodiment of the present invention shown in FIG. 1 in a third stage of use, and FIG. 4 illustrates the embodiment of the present invention shown in FIG. 1 in a fourth stage of use.

DESCRIPTION OF PREFERRED EMBODIMENTS

Referring first to FIG. 1 there is illustrated a circuit module 10 in the form of a box-like structure 12 to which is affixed a handle 14. Positioned within the box-like portion 12 of the module 10 are one or more electronic components such as transistors, condensors, resistors, etc. and associated circuitry (not shown) which are in electrical continuity with one or more "zero entry" circuit contact members 16 of known per se design. Fundamentally, such "zero entry" connectors consist of a rigid support plate 18 in which the ends of conductors 20 are positioned to the outermost ends of which are affixed leaf-like contact members 22 which are elongated, spring-like members made from electrically conductive material. As will be noted in the attached figures, such zero entry contact members are designed to be associated with corresponding contact members 24 which are interconnected with associated circuitry (not shown) by means of conductors 26 which also end in contact members 28. It should be noted that the zero entry connectors positioned within the module 10 include, in addition to the fixed plate portion 16, a vertically movable plate 30. By vertical movement of the plate 30, the contacts 22, 28, once they are juxtaposed by means of the module having been thrust into the position of maximum insertion into the receptacle 32, may then be brought into physical and therefore electrical contact. This may be utilized to effect continuity between electronic circuits and components positioned within the module and the associated circuitry, for example within the aircraft frame, to which it is desired to have the module connected.

The handle 14 includes a movable handle 34 which is pivotally affixed to handle 14 by means of a pin 37. The movable handle 34 has a rounded end 36 which will engage the peripheral surface of a pawl 38 which is also pivotally affixed to handle 14 by means of a pin 40. The rounded portion 36 of the movable handle 34 is movably connected by pins 42, 44 associated with one or more connecting bars or rods 46 to an actuation rod 48. The actuation rod 48 extends horizontally rearwards towards the back of module 10 and ends at its innermost end in a beveled surface 50. The surface 50 is designed to engage the peripheral surface of a roller 52 affixed to a vertical connecting rod 54 which is interconnected with the movable plate 30 of the zero entry connector 16. There may also be included a central slot 58 designed to receive an indexing prong 60. A switch 62 is connected to a power source (not shown) by means of a conductor 64. The path of the power circuit then proceeds through the switch and through a conductor 66 to a female power contact member 68, which is adapted to become interconnected with a power contact 70 connected to the conductors 72 which provide the primary power distribution to the inside of the module 10 when the module is in the fully closed position within its associated support frame 32. The switch 62 may be closed to cause the conductor 66 to become energized upon the switch actuation pin 62 being pushed in.

Referring next to FIG. 2 it will be noted that upon further closure of the module into its associated receptacle 32, the pawl 38 and the extreme end of the rounded portion 36 of the movable handle 34 are in a position nearly above a hasp pin 71 positioned at the end of frame 72 affixed to the outside of the receptacle 32. It should also be noted that at the back of the module, the power contact members 68 and 70, as well as the electronic circuit contact members 28 and 22 and the indexing pin 60 and its associated alignment hole 58, are all in proper position and alignment for interengagement as hereinafter described.

Referring next to FIG. 3, it will be seen that upon the module 10 arriving at the fully closed position, the indexing pin 60 will have entered the associated indexing hole 58, the pin 70 of the power contact connection will have entered the associated female receptacle 68, and the electronic circuit components 28, 22 are properly juxtaposed so that they may come into contact upon the movable plate 30 being moved upward. In this posture the movable handle 34 has been moved upward through a portion of its total path of travel, pivoting about the pin 36 and thereby causing the extreme end of the rounded portion 36 of the movable handle 34 to engage the outside of the pawl 38 which, in turn, has come into engagement with the hasp pin 71 to provide effective mechanical leverage to insure that the module will be locked in its desired position. In this connection, it should be noted that the peripheral surface of the pawl 38 is so contoured that a relatively small angular displacement of the handle 34 produces a relatively large angular displacement of the pawl 38. This is achieved by having their engaging surfaces of decreasing radius from their respective pivot pins, in the direction from which they move as the handle is closed. Thus, upon the handle 34 having moved through only a portion of its total arc path, the pawl will have been caused to move through substantially its entire arc path. By this means, the module will have been locked into position prior to the various circuits having been completed as hereinafter described. Sequentially, this motion of the movable portion 34 of the handle, through operation of the connecting bars 46, has caused the actuation rod 48 to begin to move toward the back of the module, thereby bringing the tapered surface 50 of the back of the actuation rod 48 into physical contact with the peripheral surface of the roller 52 thereby causing it to force the connecting arm 54 upward so that physical and therefore electrical interconnection will occur between the zero entry electronic component contacts 22, 28.

As will be seen from FIG. 4, final completion of closure of the movable portion 34 of the handle into its fully closed position, in which it may be latched by means of a known per se latching device 80 (as indicated in FIG. 4), will cause the rounded portion 36 of the movable handle 34 to have surrounded the pawl 38 to its fullest extent, thereby effecting a permanent locking of the module in its desired operating position. Concurrently, further rearward movement of the actuation rod 48 through operation of the connecting rod 46 will have caused the roller 52 to bear upon the top of the actuation rod 48, the roller having by then proceeded entirely up the incline 50. This causes the connecting rod 54 to effect full actuation of the movable plate 30 of the zero entry electronic connector, with consequent intimate contact under pressure of the electronic component contacts 28, 22. At the same time the extreme end 82 of the actuation rod 48 will have come to bear on the actuating pin 62 of the switch 59, thereby energizing the power circuit described by the conductors 64, the switch 59, the conductor 66, the female power receptacle 68 and into its associated male member 70, and the module power conductor 72 for distribution within the module according to the described circuitry.

It will be clear that if it is desired to remove the module the reverse of the foregoing sequence may be made to occur. To do so requires only to release the movable portion 34 of the handle by releasing the latch 80, thereby allowing the movable portion 34 to swing downward about the pivot pin 36. The effect of this will be to release the pawl 38 from its engagement with the hasp pin 71 while concurrently lifting one end of the connecting rod 46, causing the actuation rod to withdraw towards the front of the module. The effect of this first will be to permit the pin 62 in the switch 59 to return to its normally open position, thereby de-energizing the previously described power circuit. Further movement of the actuation rod toward the front of the module will bring the tapered portion 50 of the end of the actuation rod into juxtaposition with the periphery of the roller 52, thereby permitting the roller and the connecting rod 54 to drop downward causing the movable plate 30 to move downward thereby effecting disengagement of the contact members 28, 22 of the zero entry connector. Thereafter, removal of the module may be effected merely by grasping the handle 14 and pulling the module out of its associated receptacle 32 since the only elements remaining in engagement are those of the relatively strong power connection between female connector 68 and its associated male prong 70.

It should be understood that although the foregoing embodiment has been described in terms of one zero entry connector and one power connection, obviously it is possible for a multiplicity of either of such elements to be used. Further it will be obvious that more than one actuation rod might be used. For example, if a module is to be employed which is relatively narrow in the crossways dimension, a single movable handle with an associated actuation rod, etc. may suffice. On the other hand, if a comparatively wide module is used, it may be desirable to have two handles on the end of the module, each of which has a movable portion, the movable portions being interconnected by a cross member so that they can be actuated concurrently as by grasping the cross member and with the movable portions connected to more than one actuation rod. In this manner not only may physical forces be relieved and appropriately distributed but also it is possible to subdivide the circuitry within the module into discrete subsections, each of which may be serviced by separate power connections as desired.

Thus it is to be understood that embodiments herein described and shown are by way of illustration and not of limitation, and that other embodiments may be made without departing from the spirit or scope of this invention.

I claim:

1. A circuit module for insertion into an associated receptacle, said module having a rear face and a front face and comprising:
    movable closure means coupled to said module near the front face thereof for removably locking said module in an associated receptacle;
    movable pawl means, coupled to said module, having a decreasing radius of curvature with respect to its associated pivot point in the direction of actuation for effecting locking of said module with an associated receptacle,
    said movable closure means having a bearing surface near the pivot point thereof for actuating said movable pawl means to effect locking of said module with an associated receptacle;
    first movable actuator means associated with said module, extending toward said rear face and movable in response to motion of said closure means, for actuating an electrical switch means associated with an associated receptacle;
    second movable actuator means associated with said module, movable in response to motion of said closure means for actuating an electrical contact device positioned in said rear face independently of said switch means.

2. A circuit module described in claim 1 wherein said first actuator means is slideable relative to said module in a direction generally parallel to the direction of insertion of said module into a receptacle,
    and said second actuator means moves generally parallel to said rear face in a direction transverse to the direction of insertion.

3. A circuit module as described in claim 2 wherein said first actuator means is coupled to said closure means and includes a cam surface;
    and said second actuator means includes a cam follower surface;
    such that said second actuator means is moved by said first actuator means in response to motion of said closure means.

4. The module described in claim 1 wherein actuation of said closure means effects locking of the module to an associated receptacle, then actuation of said electrical contact device, and then actuation of said electrical switch means in the order stated, and reverse motion of said closure means effects undoing of each of the recited actions in the reverse order.

5. The module described in claim 4 wherein releasable latching means are provided on said module for retaining said closure means in the position in which locking and actuation of said switch means and said contact device have been effected.

* * * * *